(12) United States Patent
Xu

(10) Patent No.: US 7,345,549 B2
(45) Date of Patent: Mar. 18, 2008

(54) PHASE LOCKING ON ALIASED FREQUENCIES

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 83 days.

(21) Appl. No.: 11/364,534

(22) Filed: Feb. 28, 2006

(65) Prior Publication Data

US 2007/0205836 A1  Sep. 6, 2007

(51) Int. Cl.
*H03L 7/085* (2006.01)
(52) U.S. Cl. .......................... 331/1 A; 331/77
(58) Field of Classification Search ................ 331/1 A, 331/77
See application file for complete search history.

(56) References Cited

U.S. PATENT DOCUMENTS 5,068,628 A * 11/1991 Ghoshal .................... 331/1 A
5,760,653 A * 6/1998 Soda ......................... 331/1 A
6,356,129 B1  3/2002 O'Brien
6,603,362 B2  8/2003 Von Dolteren, Jr.
2005/0218997 A1  10/2005 Xu

* cited by examiner

*Primary Examiner*—Joseph Chang
(74) *Attorney, Agent, or Firm*—Bruce D. Rubenstein

(57) ABSTRACT

A phase-locked loop (200) includes a sampler (202), a phase detector (210), a loop filter (212), and a VCO (214). The loop achieves frequency multiplication without the need for a divider in the loop's feedback path. The VCO (214) is operated above the Nyquist rate of the sampler, causing the loop to lock on an aliased signal. Any variations in the VCO output frequency (i.e., jitter or phase noise) are fed back to the phase detector (210) 1-for-1, without attenuation normally associated with frequency dividers. Loop gain can therefore be kept high, even in loops that provide high closed loop frequency multiplication. According to one variation, a harmonic generator (540) is placed between the VCO and the sampler, thus causing the loop to lock on harmonics of the VCO frequency. Open loop gain and precision are thus further improved.

28 Claims, 4 Drawing Sheets

PHASE LOCKING ON ALIASED FREQUENCIES

CROSS-REFERENCES TO RELATED APPLICATIONS

The following patent document is incorporated by reference herein in its entirety:

U.S. patent application Ser. No. 10/817,780, entitled "High Performance Signal Generation," filed Apr. 2, 2004.

STATEMENT REGARDING FEDERALLY SPONSORED RESEARCH OR DEVELOPMENT

Not Applicable.

REFERENCE TO MICROFICHE APPENDIX

Not Applicable

BACKGROUND

1. Field of the Invention

This invention relates generally to automatic test equipment for electronics, and, more particularly, to techniques for generating periodic signals for testing electronic devices.

2. Description of the Related Art

Electronics manufacturers commonly use automatic test equipment (ATE) for testing semiconductor components and electronic assemblies. ATE reduces costs to manufacturers by allowing products to be tested early in the manufacturing process. Early testing allows defective units to be identified and discarded before substantial additional costs are incurred. In addition, ATE allows manufacturers to grade different units according to their tested levels of performance. Better performing units can generally be sold at higher prices.

One of the basic functions of ATE is to generate signals of predetermined frequency. These signals may include, for example, digital clocks, analog waveforms, and RF waveforms. Often, particular testing scenarios require a test system to produce multiple signals of different frequency. Commonly, frequency and phase differences between different signals must be precisely controlled. Phase-locked loops are commonly used in ATE systems to produce signals with precisely controlled frequency and phase.

FIG. 1 shows a block diagram of a conventional phase-locked loop (PLL) 100. The PLL 100 receives an input signal, $F_{IN}$, and generates an output signal, $F_{OUT}$. The PLL 100 includes a phase detector 110, a loop filter 112, and a voltage-controlled oscillator (VCO) 114. It also includes an output frequency divider 118 and a feedback frequency divider 116. The input signal, $F_{IN}$, may be supplied by any suitable source, such as a crystal oscillator.

The conventional PLL 100 is a closed loop feedback system that operates essentially as follows. The phase detector 110 compares the input signal $F_{IN}$ to the feedback signal $F_{FB}$ to generate an error signal, which varies in relation to the difference in phase between $F_{IN}$ and $F_{FB}$. The loop filter 112 smoothes the error signal and generally helps to stabilize the feedback loop. The VCO 114 converts the filter's output signal into an oscillatory signal, $F_{VCO}$, which has a frequency that varies in relation to the filter's output signal. The feedback divider 116 (generally a counter) divides the frequency of $F_{VCO}$ by an integer, M, to produce the feedback signal, $F_{FB}$. Outside the loop, the output divider 118 divides the frequency of $F_{VCO}$ by an integer, N, to produce $F_{OUT}$. As the feedback tends to drive the difference between $F_{IN}$ and $F_{FB}$ to zero, it consequently drives the frequency of $F_{VCO}$ to a value equal to the frequency of $F_{IN}*M$, and therefore tends to drive the frequency of the output signal $F_{OUT}$ to a value equal to the frequency of $F_{IN}*M/N$.

The conventional PLL 100 provides many benefits. For example, output frequency $F_{OUT}$ can be varied, through appropriate selection of N and M, over a wide range of values. In addition, phase noise in the PLL can generally be reduced by setting the bandwidth of the loop filter 112 to arbitrarily low values.

Nevertheless, we have recognized certain shortcomings in the PLL 100, which limits its usefulness in many ATE applications. High frequency applications, such as RF signal generation, require high frequency VCOs. The speed of the VCOs in these applications often greatly exceeds the speed of the phase detectors. This problem is conventionally addressed by making the value of M in the feedback divider 116 very large.

Making the value of M large involves certain drawbacks, however. For instance, the larger the value of M, the greater the reduction in the open-loop gain of the PLL 100. As is known, reducing open-loop gain increases loop tracking errors. It also impairs the ability of the loop to reject noise. To illustrate this effect, consider that the feedback divider 116 not only divides the frequency of $F_{VCO}$ by M, but it also divides any variations (i.e., phase noise or, equivalently, timing jitter) by the same value of M. Sensitivity is therefore reduced.

The frequency divider 116 also adds noise directly. Frequency dividers are commonly implemented as counters, which are known to create spurious noise at their outputs. Although this noise can be attenuated by the loop filter 112, attenuation cannot generally be achieved without setting the bandwidth of the loop filter to a much lower frequency than the offending noise components of the divider 116. Reducing bandwidth to this degree, however, has the effect of reducing programming speed of the PLL 100, which can negatively impact ATE system performance and throughput.

What is desired is a phase-locking circuit that can produce high frequency signals with low phase noise, without sacrificing programming speed.

SUMMARY

In accordance with the present invention, a phase-locking circuit employs a sampler for producing aliased feedback signals, upon which a circuit is caused to lock.

BRIEF DESCRIPTION OF THE DRAWINGS

The ensuing description will be better understood by reference to the accompanying drawings, in which—

DETAILED DESCRIPTION OF THE PREFERRED EMBODIMENT

Figure 2:
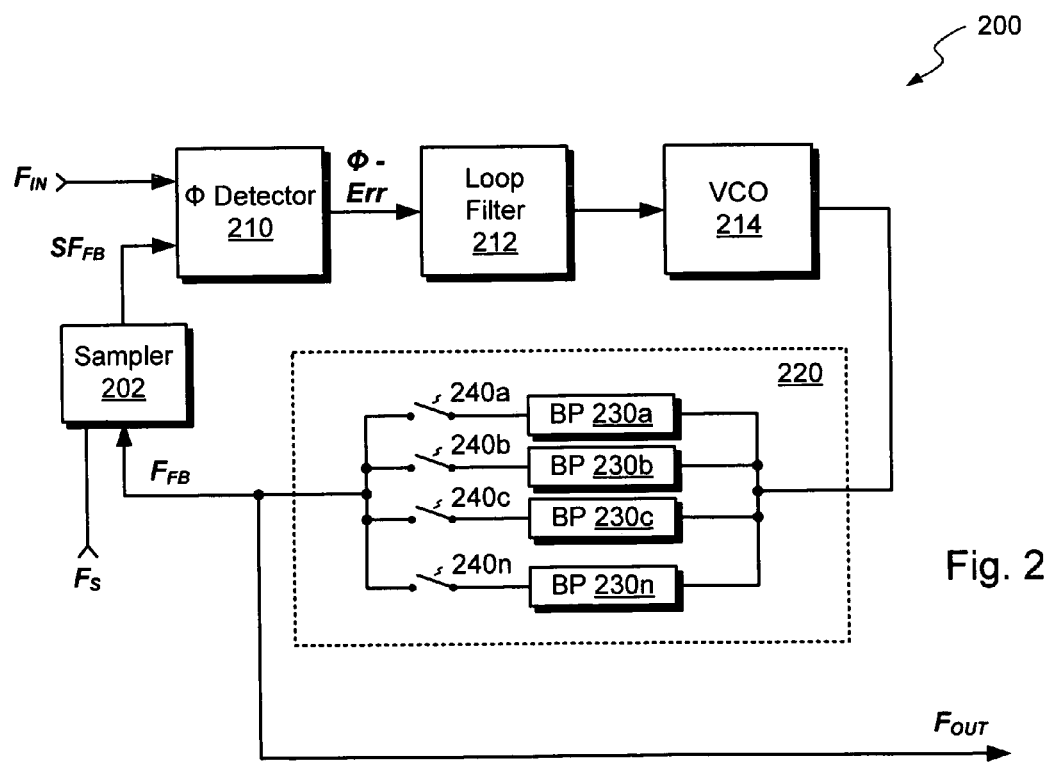
FIG. 2 is a block diagram of phase-locking circuitry according to an illustrative embodiment of the invention.

FIG. 2 shows an illustrative embodiment of a phase-locking circuit 200. The phase-locking circuit 200 receives an input signal, $F_{IN}$, and produces an output signal, $F_{OUT}$. The circuit 200 includes a sampler 202, a phase detector 210, a loop filter 212, and a controllable oscillator, such as a VCO (voltage-controlled oscillator) 214. The sampler 202 receives a feedback signal, $F_{FB}$, at its input and provides a sampled feedback signal, $SF_{FB}$, at its output. The phase detector 210 has 2 inputs and an output. The first input receives the input signal $F_{IN}$, and the second input receives the sampled feedback signal, $SF_{FB}$. The loop filter 212 and the VCO 214 each have an input and an output.

The circuit 200 also includes a circuit path 220, coupled from the output of the VCO 214 to the input of the sampler 202, for providing the feedback signal, $F_{FB}$. Bandpass filters 230a-230n are preferably provided in the circuit path 220. These bandpass filters are preferably individually selectable via switches 240a-240n. Each filter preferably has a different center frequency.

During operation, the sampler 202 is made to sample the feedback signal, $F_{FB}$, at a sampling rate $F_S$. The phase detector 210 receives the sampled feedback signal, $SF_{FB}$, and outputs an error signal, Φ-Err. The error signal varies in response to the difference between $SF_{FB}$ and $F_{IN}$. The loop filter 212 filters the error signal and helps to stabilize the loop. The VCO 214 converts the filtered error signal into an oscillatory waveform, $F_{VCO}$. The frequency of $F_{VCO}$ varies in response to the level of the filtered error signal.

One of the bandpass filters 230a-230n is selected for filtering noise from $F_{VCO}$. The selected filter is preferably the one having the center frequency that is closest to the expected frequency of the $F_{VCO}$. The desired filter is selected by closing its associated switch (one of 240a-240n) and opening the remaining switches.

The circuit 200 behaves in an essentially normal manner when the frequency of $F_{VCO}$ is less than the Nyquist rate ($F_S/2$) of the sampler. However, significant differences arise when the frequency of $F_{VCO}$ is greater than the Nyquist rate.

As is known, a phenomenon called "aliasing" arises in discrete-time systems when a signal being sampled at a rate $F_S$ contains frequency components greater than $F_S/2$. Aliasing causes out-of-band frequencies, e.g., those above the Nyquist rate, to appear as images within the system's bandwidth. These images are normally regarded as errors. However, we have recognized that these aliased images can be used to improve performance.

Figure 3:
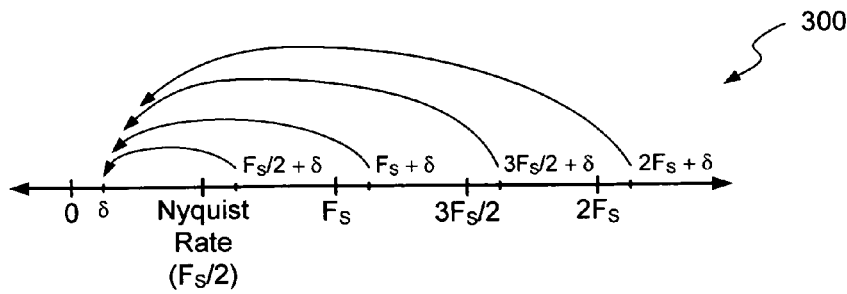
FIG. 3 is a frequency plot showing how frequencies higher than the Nyquist rate can alias to frequencies lower than the Nyquist rate in the circuit of FIG. 2.

FIG. 3 shows a frequency plot of a discrete-time system that is sampled at a rate $F_S$. The horizontal line represents frequency, with zero frequency (DC) appearing at the left and increasing frequencies extending to the right. Frequencies are represented in multiples of the Nyquist rate, $F_S/2$. As shown, frequencies above the Nyquist rate produce aliased images within the system bandwidth (i.e., below the Nyquist rate). In particular, any component that is an increment δ greater than any multiple of the Nyquist rate produces an aliased image at a frequency δ within the system bandwidth.

The creation of aliased images has significant consequences in the phase-locking circuit of FIG. 2. When the frequency of $F_{VCO}$ exceeds $F_S/2$, an aliased image of that frequency appears within the sampler's bandwidth and the circuit is made to lock on that image. This means that the phase-locking circuit 200 can be operated with substantial gain without requiring a frequency divider in its feedback path. The circuit 200 can be made to produce arbitrarily high frequencies, limited only by its analog characteristics.

Output frequency ambiguity can arise if the VCO 214 operates over too large a frequency range. For instance, if the output range (maximum frequency minus minimum frequency) exceeds $F_S/2$, then the phase-locking circuit may be able to satisfy its feedback conditions at two or more different VCO frequencies. Preferably, this condition is avoided by limiting the bandwidth of each of the bandpass filters 230a-230n to less than $F_S/2$. Alternatively, it may be avoided by selecting a VCO 214 that has an output range less than $F_S/2$.

Significant performance benefits arise from the use of aliased images in the phase-locking circuit 200. These are best understood with reference to FIG. 4.

Figure 1:
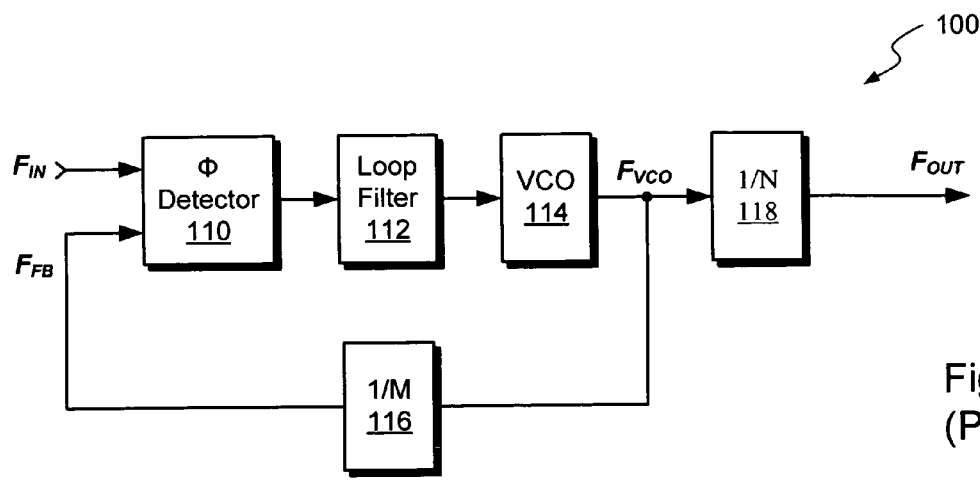
FIG. 1 is a block diagram of a conventional phase-locked loop that is operable to produce a wide range of frequencies.
Figure 4:
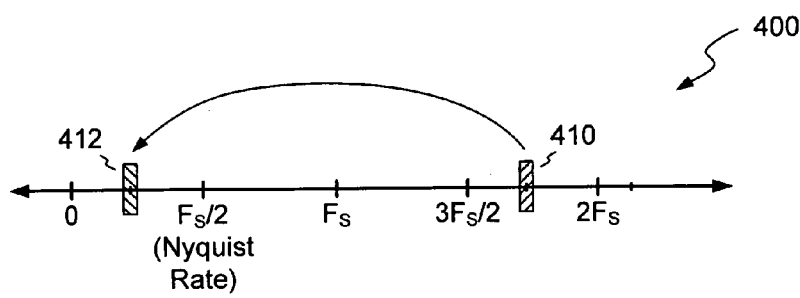
FIG. 4 is a frequency plot showing how a band of frequencies higher than the Nyquist rate can alias to a band of frequencies lower than the Nyquist rate in the circuit of FIG. 2.

FIG. 4 is a frequency plot that shows the effect of aliasing on a band of frequencies. As shown, a band or range of frequencies 410 above the Nyquist rate is aliased to create a mirror image 412 within the system bandwidth. Significantly, the width of the bands 410 and 412 are identical. If the band 410 is 1 kHz wide, the band 412 will be 1 kHz wide. If it is assumed that the band 410 represents the frequencies produced by the VCO 214, then the width of the band 410 can be regarded as the phase noise (or equivalently, timing jitter) in $F_{VCO}$. In the conventional phase-locked loop of FIG. 1, the feedback divider would reduce the width of the band 410, effectively reducing loop gain and sensitivity. In the phase-locking circuit of FIG. 2, however, loop gain and sensitivity are preserved. The phase noise around $F_{VCO}$ is aliased back into the system's bandwidth without compression or attenuation.

The use of aliased signals therefore allows the phase-locking circuit 200 to be operated at high gain (where $F_{OUT}$ is much greater than $F_{IN}$) without the need for feedback dividers. It allows open loop gain and therefore precision to be kept high. Since feedback dividers are not required, the noise spurs normally introduced by these devices are avoided. Therefore, the need to slow down the loop filter and suffer the consequent reduction in programming speed is also avoided.

Figure 5:
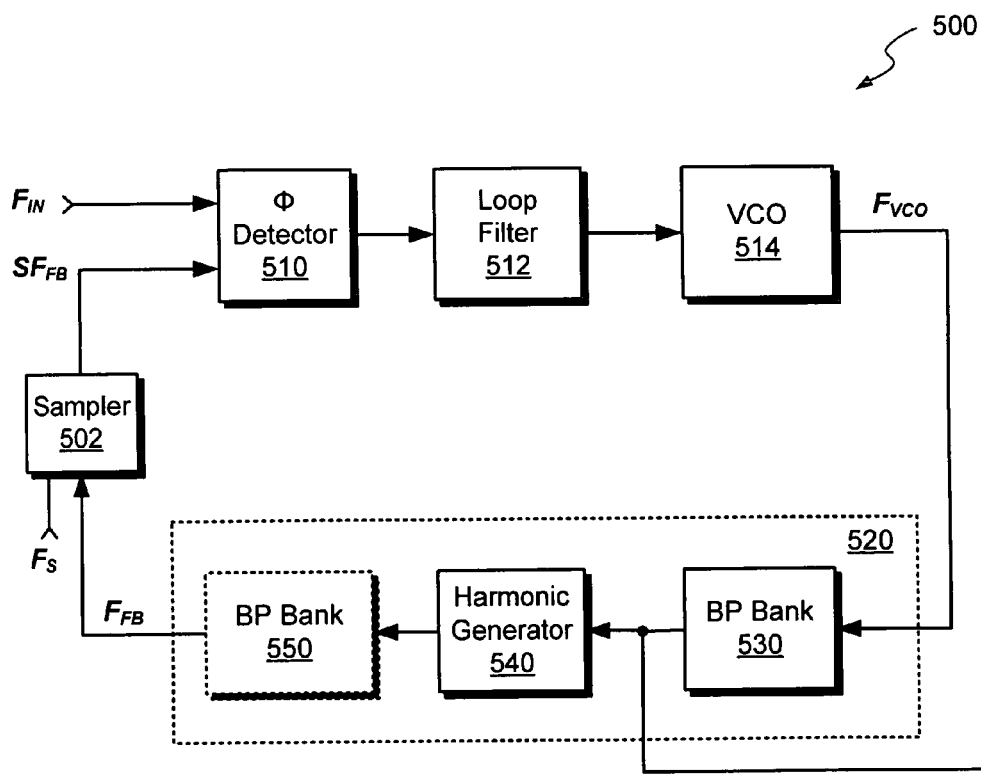
FIG. 5 is a simplified schematic of an illustrative embodiment of phase-locking circuitry, wherein harmonics of the VCO output signal are employed to improve precision.

FIG. 5 shows another illustrative embodiment of phase-locking circuitry. A phase-locking circuit 500 includes a sampler 502, a phase detector 510, a loop filter 512, a controllable oscillator, such as a VCO 514, and a bank of bandpass filters 530. These are similar to the sampler 202, phase detector 210, loop filter 212, VCO 214, and bandpass bank of FIG. 2. However, the circuit 500 also includes a harmonic generator 540.

The harmonic generator 540 receives a filtered version of $F_{VCO}$ and generates one or more harmonics of that signal. These harmonics, or overtones, have frequencies that are integer multiples of the frequency of $F_{VCO}$, i.e., the fundamental frequency.

A second bandpass bank 550 is optionally coupled to the output of the harmonic generator 540. The second bandpass bank 550 may be used to select one or more specific harmonics to be presented to the sampler 502. Selection of particular harmonics is not required, however.

The harmonic generator 540 effectively multiplies the width of noise bands fed back to the sampler 502. It therefore further increases open loop gain and sensitivity of the phase-locking circuit 500.

Figure 6:
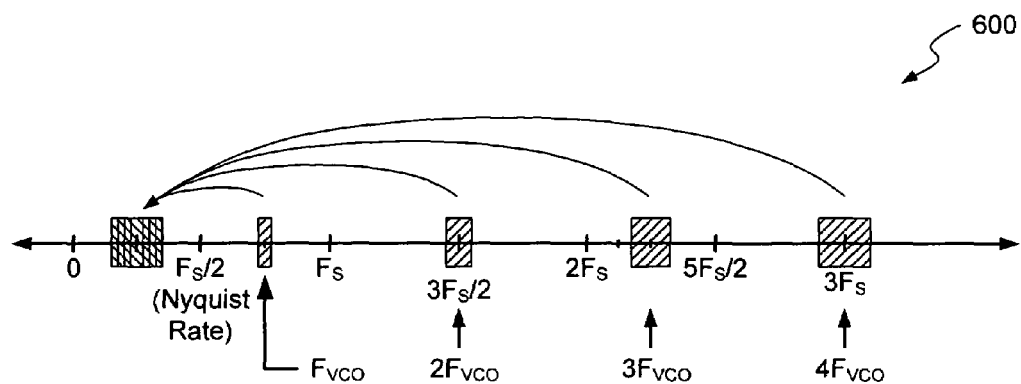
FIG. 6 is a frequency plot showing how various bands of harmonics are created in the circuit of FIG. 5, wherein one or more of the harmonic bands are aliased to frequencies lower than the Nyquist rate.

FIG. 6 is a frequency plot that shows the mechanism by which phase noise is multiplied. As shown, $F_{VCO}$ and its harmonics create aliased images within the system's bandwidth. Significantly, a width of a band of phase noise around each harmonic of $F_{VCO}$ can be seen to vary in proportion to the order of the harmonic. For example, the band of noise around the $3F_{VCO}$ is three times as wide as the band around $F_{VCO}$. Each of these bands is aliased back into the bandwidth of the system. Absent a bandpass bank 550, all of these aliased bands appear simultaneously at the input of the sampler 502.

The elements of the phase-locking circuits 200/500 can be implemented in a wide variety of ways. The phase detector 210/510 can be either an analog phase detector or a digital phase detector. Similarly, the loop filter 212/512 can be either an analog loop filter or a digital loop filter. Analog and digital phase detectors and loop filters are well-known in the art.

If an analog phase detector is used, the sampler 202/502 is implemented as an analog sampling circuit, such as a sample-and-hold circuit or a track-and-hold circuit. These devices are well-known and readily available off the shelf. In this arrangement, the input signal $F_{IN}$ is preferably an analog signal, such as the output of a crystal oscillator.

If a digital phase detector is used, the sampler 202/502 preferably includes an analog sampling circuit (described above) coupled to an analog-to-digital converter (ADC). The analog sampling circuit and ADC are both clocked at $F_S$. Preferably, a sampling ADC is used, i.e., one which includes both an analog sampling circuit and an ADC in a single device package. Digital values are thus provided to the phase detector at a rate $F_S$. In this arrangement, $F_{IN}$ is preferably a digital signal.

The VCO 214/514 is preferably a conventional type. VCOs are well-known and are commercially available off the shelf.

The harmonic generator 540 is preferably implemented as a non-linear analog circuit, such as a clipping circuit or a commercially available RF comb generator. As is known, clipping circuits flatten the positive and negative peaks of a sinusoid, thus introducing harmonics of the sinusoid's fundamental frequency. Optionally, the harmonic generator 540 may be equipped with an amplifier for boosting low amplitude harmonics.

Figure 7:
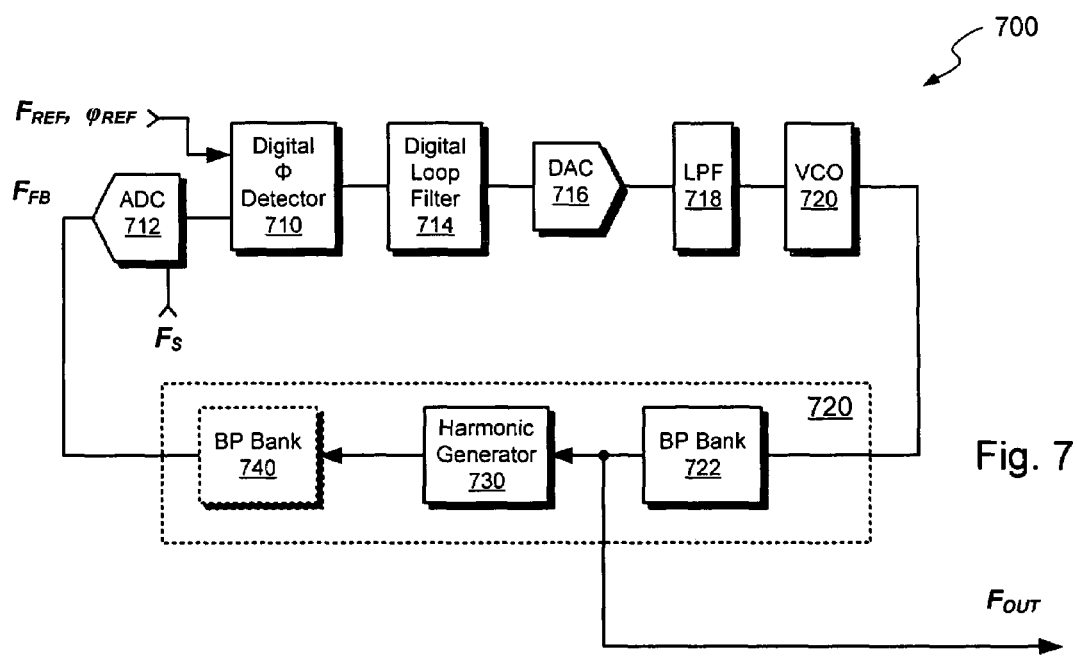
FIG. 7 is a block diagram showing an illustrative embodiment of phase-locking circuitry that employs a digital phase detector and a digital loop filter.

FIG. 7 shows a largely digital embodiment of a phase-locking circuit 700 with a particular arrangement of elements. The circuit includes a digital phase detector 710 and a sampling ADC 712. The digital phase detector 710 is preferably of a type described in U.S. patent application Ser. No. 10/817,780, entitled "High Performance Signal Generation," which is hereby incorporated by reference. This digital phase detector is preferred in this implementation because it offers extremely high precision and generates very low noise. The digital phase detector receives input data, $F_{REF}$, $\Phi_{REF}$, which is indicative of a reference frequency and a reference phase. The digital phase detector 710 compares this reference frequency and phase with a sampled feedback signal from the sampling ADC 712 to produce a digital phase error. A digital loop filter 714 filters the digital phase error, and a digital-to-analog converter (DAC) converts the filtered phase error into an analog signal. An analog filter smoothes the output of the DAC 716, and a VCO 720 converts the smoothed DAC output into an oscillatory signal. A first bandpass filter bank 722, a harmonic generator 730, and an optional second bandpass bank 740 operate essentially as described above in connection with the first bandpass bank 530, the harmonic generator 540, and the optional second bandpass bank 550 of FIG. 5.

The digital loop filter 714 offers a particular advantage in the circuit 700. If any of the circuit elements, such as the ADC 712 or DAC 716, are found to repeatably generate noise at known frequencies, or if noise at certain known frequencies is injected into circuit from its environment, the digital loop filter 714 can be programmed to have low gain, or a "zero," at each offending noise frequency. Designing the loop filter 714 in this fashion reduces noise in the output signal, $F_{OUT}$, and contributes to the overall precision of the circuit.

Figure 8:
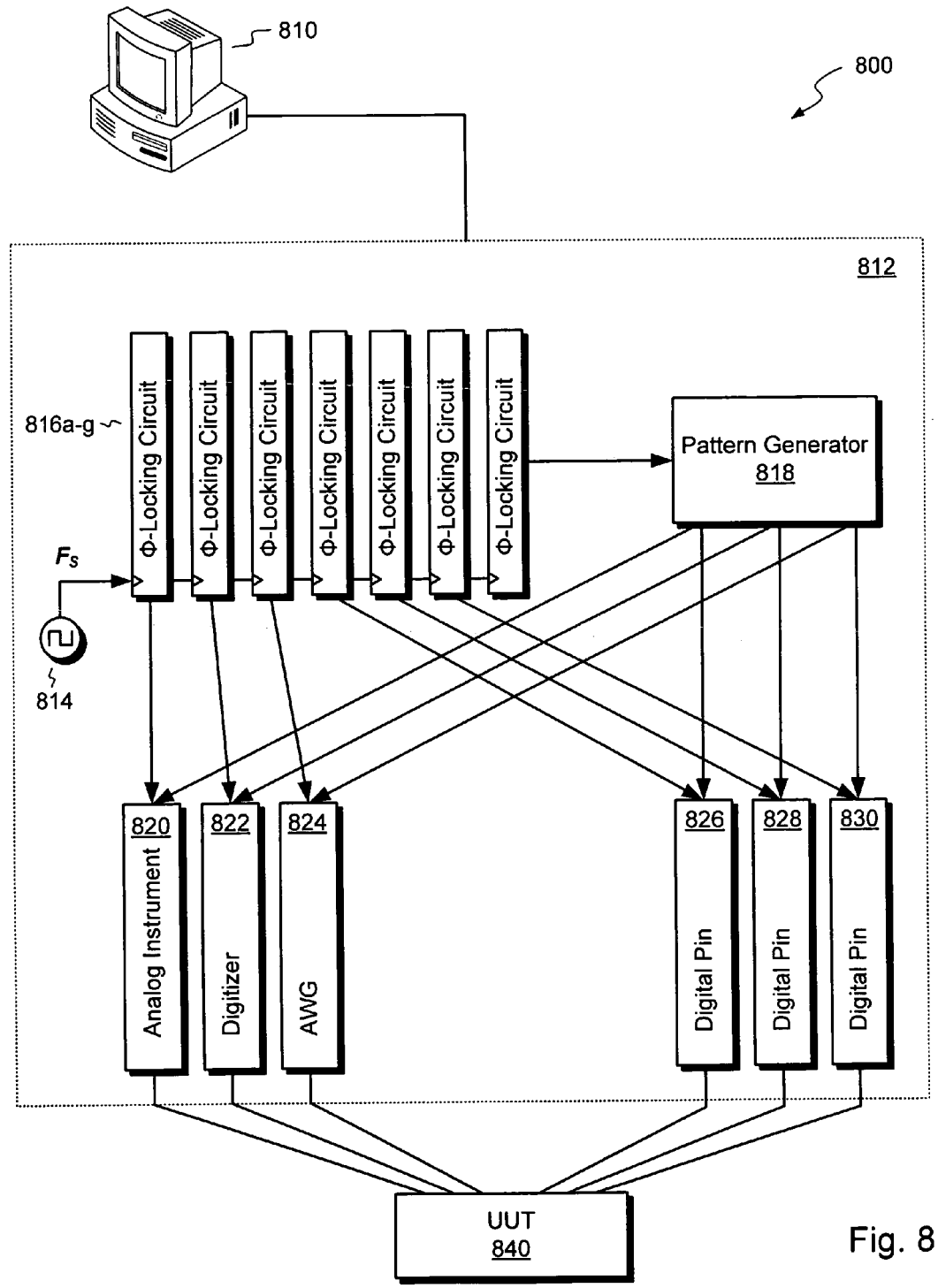
FIG. 8 is a simplified block diagram of automatic test equipment that includes phase locking circuitry according to one or more embodiments of the invention.

FIG. 8 shows an application of phase-locking circuits of the types shown in FIGS. 2, 5, and 7. As shown in FIG. 8, an automatic test system 812 is controlled by a host computer 810 for testing a UUT (unit under test) 840. The UUT may be any type of device or assembly to be tested. The automatic test system 812 includes instruments, such as an analog instrument 820, a digitizer 822, and an arbitrary waveform generator (AWG) 824. The automatic test system 812 also includes a plurality of digital electronic channels, shown generally as digital pins 826, 828, and 830. The digital electronic channels are arranged for sourcing and sensing digital signals.

Notably, the automatic test system 812 includes a plurality of phase-locking circuits 816a-g. These phase-locking circuits are of the same general type shown in any of FIGS. 2, 5, and 7. The phase-locking circuits 816a-g each receive a clock signal, $F_S$, from a system clock 814. They each also receive respective input signals (or data) from the host computer 810 for specifying desired output frequencies and phases. In response to the clock and respective input, the phase-locking circuits 816a-g each generate a respective periodic output signal. The output signals are provided to the instruments 820, 822, and 824, which can use frequency references or clocks for their normal operation. The output signals also provide clocks for controlling the digital pins 826, 828, and 830. They may further be used to provide a frequency reference for a pattern generator 818. The pattern generator 818 operates in conjunction the with phase-locking circuits for causing the digital pins to source and/or sense digital signals with specified formatting and at precisely controlled instants of time.

Having described certain embodiments of the invention hereof, numerous alternative embodiments or variations can be made. For example, although phase-locking circuits shown and described preferably include a bank of bandpass filters (230, 530, and 722) coupled to the output of the VCO, these filters are not strictly required. In addition, although the bandpass filters are preferably implemented as analog filters that precede the sampler (202, 502) or the sampling ADC (712), they can alternatively be implemented as digital filters provided at the output of the sampler or sampling ADC.

A particular advantage of the phase-locking circuits disclosed is that they provide closed loop frequency gain without requiring frequency dividers (such as counters) in their feedback paths. This should not be taken to mean, however, that feedback dividers are prohibited. Certain instances may arise wherein feedback dividers are deemed desirable in the context of the circuits disclosed. Aliasing will occur, even with feedback dividers, provided that the overall frequency gain (output frequency divided by input frequency) of the circuit path between the VCO and the sampler is greater than $F_S/2F_{MIN}$, where $F_{MIN}$ represents the lowest frequency provided by the VCO.

The sampling rate $F_S$, with which the sampler (202, 502) or sampling ADC (712) is operated, is preferably fixed. However, this is not required. It may also be variable. According to one variant, $F_S$ may be derived from the output of the VCO.

As shown and described, the VCO is made to operate at frequencies higher than the Nyquist rate ($F_S/2$); however, this is not required, either. Aliasing can occur with VCO frequencies below the Nyquist rate if a harmonic generator (540, 730) produces harmonics above the Nyquist rate.

Those skilled in the art will therefore understand that various changes in form and detail may be made to the embodiments disclosed herein without departing from the scope of the invention.

What is claimed is:

1. Phase-locking circuitry, comprising:
   a sampler, having an input and an output, constructed and arranged for operating at a sampling rate $F_S$;
   a phase detector, having an input and an output, the input being coupled to the output of the sampler;
   a controllable oscillator having an input and an output, the input being coupled to the output of the phase detector; and
   a circuit path coupled from the output of the controllable oscillator to the input of the sampler, the circuit path being constructed and arranged to deliver a feedback signal to the sampler having a frequency greater than $F_S/2$,
   wherein the circuit path comprises a bank of band-pass filters.

2. Phase-locking circuitry as recited in claim 1, wherein the controllable oscillator is operable to generate an output signal having a frequency greater than $F_S/2$.

3. Phase-locking circuitry as recited in claim 1, wherein the bank of band-pass filters comprises a plurality of band-pass filters each having a different center frequency and each having a bandwidth less than $F_S/2$.

4. Phase-locking circuitry as recited in claim 1, wherein the input of the phase detector is a first input, and the phase detector furter has a second input arranged for receiving an oscillatory analog signal.

5. Phase-locking circuitry as recited in claim 1, wherein the input of the phase detector is a first input, and the phase detector further has a second input arranged for receiving a digital value indicative of a desired output frequency.

6. Phase-locking circuitry as recited in claim 1, wherein the circuit path comprises a non-linear element constructed and arranged for generating at least one harmonic of a signal generated by the controllable oscillator.

7. Phase-locking circuitry as recited in claim 1, further comprising a loop filter coupled between the output of the phase detector and the input of the controllable oscillator.

8. Phase-locking circuitry as recited in claim 7, wherein the loop filter comprises a digital loop filter.

9. Phase-locking circuitry, comprising:
   a sampler, having an input and an output, constructed and arranged for operating at a sampling rate $F_S$;
   a phase detector, having an input and an output, the input being coupled to the output of the sampler;
   a controllable oscillator having an input and an output, the input being coupled to the output of the phase detector; and
   a circuit path coupled from the output of the controllable oscillator to the input of the sampler, the circuit path being constructed and arranged to deliver a feedback signal to the sampler having a frequency greater than $F_S/2$,
   wherein the circuit path comprises a non-linear element constructed and arranged for generating at least one harmonic of a signal generated by the controlled oscillator, and
   wherein the non-linear element is one of a clipping circuit and a frequency comb generator.

10. Phase-locking circuitry, comprising:
    a sampler, having an input and an output, constructed and arranged for operating at a sampling rate $F_S$;
    a phase detector, having an input and an output, the input being coupled to the output of the sampler;
    a controllable oscillator having an input and an output, the input being coupled to the output of the phase detector; and
    a circuit path coupled from the output of the controllable oscillator to the input of the sampler, the circuit path being constructed and arranged to deliver a feedback signal to the sampler having a frequency greater than $F_S/2$,
    wherein the circuit path comprises a non-linear element constructed and arranged for generating at least one harmonic of a signal generated by the controlled oscillator, and
    wherein the circuit path further comprises a bank of selectable band-pass filters coupled between the output of the controllable oscillator and the non-linear element.

11. A phase-locking circuit, comprising:
    a sampler, having an input and an output;
    a phase detector, having an input and an output, the input being coupled to the output of the sampler;
    a controllable oscillator having an input and an output, the input being coupled to the output of the phase detector; and
    a harmonic generator including one of a clipping circuit and a frequency comb generator coupled between the output of the controllable oscillator and the input of the sampler.

12. A phase-locking circuit as recited in claim 11, further comprising a bank of band-pass filters coupled between the controllable oscillator and the harmonic generator.

13. A phase-locking circuit as recited in claim 12, wherein the bank of band-pass filters comprises a plurality of band-pass filters each having a different center frequency.

14. A phase-locking circuit as recited in claim 12, further comprising a bank of selectable band-pass filters coupled between the non-linear element and the sampler.

15. A phase-locking circuit as recited in claim 11, further comprising a bank of selectable band-pass filters coupled between the non-linear element and the sampler.

16. A phase-locking circuit as recited in claim 11, wherein the sampler is operable at a sampling rate $F_S$, and the harmonic generator is constructed and arranged for generating at least one harmonic having a frequency greater than $F_S/2$.

17. Phase-locking circuitry, comprising:
    a sampler, having an input and an output, constructed and arranged for operating at a sampling rate;

a phase detector, having an input and an output, the input being coupled to the output of the sampler;

a controllable oscillator having an input and an output, the input being coupled to the output of the phase detector, the controllable oscillator being constructed and arranged for generating a range of operating frequencies; and a circuit path coupled from the output of the controllable oscillator to the input of the phase detector and having a frequency gain greater than one.

18. A method of phase-locking, comprising:

generating an oscillatory signal having a fundamental frequency, the oscillatory signal having at least one component with a frequency greater than $F_S/2$;

sampling the oscillatory signal at a sampling rate $F_S$ to produce a sampled signal having at least one aliased component;

generating a phase error responsive to a difference between the sampled signal and a reference signal; and varying the fundamental frequency of the oscillatory signal in response to the phase error, wherein the step of generating the oscillatory signal comprises:

generating a precursor of the oscillatory signal; and band-pass filtering the precursor of the oscillatory signal.

19. A method as recited in claim 18, wherein the step of generating the oscillatory signal further comprises generating at least one harmonic of the band-pass filtered precursor of the oscillatory signal.

20. A method as recited in claim 18, wherein the step of generating the oscillatory signal further comprises, prior to the step of band-pass filtering, generating at least one harmonic of the precursor of the oscillatory signal.

21. A method as recited in claim 20, further comprising band-pass filtering the at least one harmonic of the precursor of the oscillatory signal.

22. A method as recited in claim 18, further comprising filtering the phase error.

23. A method as recited in claim 22, wherein the step of filtering the phase error comprises digitally filtering the phase error.

24. An automatic test system, comprising:

a host computer adapted for running a test program;

a plurality of phase-locking circuits, operative in response to data from the host computer, for producing a plurality of reference frequencies; and a plurality of instruments, coupled to the plurality of phase-locking circuits and adapted for generating a stimulus signal and/or receiving a response signal responsive to the plurality of reference frequencies, wherein each of the plurality of phase-locking circuits includes— a sampler, having an input and an output, constructed and arranged for operating at a sampling rate $F_s$;

a phase detector, having an input and an output, the input being coupled to the output of the sampler;

a controllable oscillator having an input and an output, the input being coupled to the output of the phase detector; and a circuit path coupled from the output of the controllable oscillator to the input of the sampler, the circuit path being constructed and arranged to deliver a feedback signal to the sampler having a frequency greater than $F_s/2$, wherein the circuit path comprises a bank of band-pass filters.

25. An automatic test system as recited in claim 24, wherein the input of the phase detector is a first input, and the phase detector further has a second input for receiving data indicative of a desired output frequency.

26. An automatic test system as recited in claim 24, wherein the plurality of instruments comprises a digital drive circuit.

27. An automatic test system as recited in claim 24, wherein the plurality of instruments comprises an analog source.

28. An automatic test system as recited in claim 24, wherein the plurality of instruments comprise an RF source.

* * * * *